United States Patent [19]

Tobimatsu

[11] Patent Number: 5,171,711
[45] Date of Patent: Dec. 15, 1992

[54] METHOD OF MANUFACTURING INTEGRATED CIRCUIT DEVICES

[75] Inventor: Hiroshi Tobimatsu, Hyogo, Japan

[73] Assignee: Mitsubishi Denki Kabushiki Kaisha, Tokyo, Japan

[21] Appl. No.: 774,986

[22] Filed: Oct. 17, 1991

[30] Foreign Application Priority Data

Oct. 18, 1990 [JP] Japan .................... 2-281030

[51] Int. Cl.$^5$ .................... H01L 21/44; H01L 21/48
[52] U.S. Cl. .................... 437/182; 437/192; 437/209; 437/944; 148/DIG. 100
[58] Field of Search ............... 437/182, 183, 192, 193, 437/209, 944; 148/DIG. 100

[56] References Cited

U.S. PATENT DOCUMENTS

| | | | |
|---|---|---|---|
| 4,742,023 | 5/1988 | Hasegawa | 437/183 |
| 4,800,177 | 1/1989 | Nakamae | 437/192 |
| 4,855,251 | 8/1989 | Iyogi et al. | 437/182 |
| 4,880,708 | 1/1989 | Sharma et al. | 437/192 |
| 4,923,827 | 5/1990 | Calviello | 437/192 |
| 4,948,754 | 8/1990 | Kondo et al. | 437/182 |
| 4,997,778 | 3/1991 | Sim et al. | 148/DIG. 100 |
| 5,000,818 | 3/1991 | Thomas et al. | 437/192 |
| 5,006,478 | 4/1991 | Kobayashi et al. | 148/DIG. 100 |
| 5,057,447 | 10/1991 | Paterson | 437/192 |
| 5,059,553 | 10/1991 | Berndlmaier et al. | 437/192 |

FOREIGN PATENT DOCUMENTS

| | | | |
|---|---|---|---|
| 54-43464 | 4/1979 | Japan | 437/182 |
| 54-134975 | 10/1979 | Japan | 437/182 |
| 63-275127 | 11/1988 | Japan | 437/182 |
| 1-27247 | 1/1989 | Japan | 437/183 |

*Primary Examiner*—Brian E. Hearn
*Assistant Examiner*—Kevin M. Picardat
*Attorney, Agent, or Firm*—Lowe, Price, LeBlanc & Becker

[57] ABSTRACT

A method of manufacturing IC devices is applied in forming bumps on an electrode pads to be an input/output terminal of the ICs with a conductive metal layer interposed therebetween. Firstly, a first resist having a prescribed opening is formed over a semiconductor substrate having the electrode pads formed thereon. Thereafter, the metal layer is formed over the semiconductor substrate, and furthermore, a second resist is formed over it by making an opening in a region almost the same as the opening of the first resist. Then, the second resist is removed after forming the bumps within the opening of the second resist. Thereafter, the first resist is removed after removing an exposed portion of the metal layer. According to the processes, overetching of and generation of an etching residue of the metal layer are prevented.

20 Claims, 11 Drawing Sheets

METHOD OF MANUFACTURING INTEGRATED CIRCUIT DEVICES

BACKGROUND OF THE INVENTION

1. Field of the Invention

The invention relates generally to a method of manufacturing integrated circuit (hereinafter referred to as "IC") devices and, more particularly, relates to a method of manufacturing IC devices including a process of forming bumps which are mainly formed along the neighborhood of the periphery of an IC chip as terminals for interconnection with external electrode terminals.

2. Description of the Background Art

As the integration density of IC devices has been increased in recent years, a pitch in the arrangement of electrode pads for interconnection with external terminals has become smaller, i.e., on the order of 100μm. Accordingly, interconnection by conventional wire bonding has become difficult, so that a system is presently employed in which bumps are formed on electrode pads in advance and a lead connection terminal is bonded to the same.

Firstly, a description will now be made of an outline of a process of manufacturing IC devices with bumps as terminals to which the present invention is applied, taking a case as an example where a process of inner lead bonding by TAB (Tape Automated Bonding) assembly process is included, with reference to FIGS. 1A to 1C. Firstly, a plurality of IC chips 2 are formed on a semiconductor substrate wafer 1 in a wafer process shown in FIG. 1A. Then, as shown in FIG. 1B, bumps 3 are formed on electrode pads to be input/output terminals of the IC circuits arranged along the neighborhood of periphery of each IC chip 2. Next, finished IC chips 2 are disconnected and separated one by one. Referring to FIG. 1C, the disconnected and separated IC chips 2 are bonded to the terminals arranged inside inner leads 5 carried by a tape carrier 4 at bumps 3.

FIGS. 2A to 2C show the processes performed until one IC chip 2 is bonded with inner leads.

The IC devices with bumps formed by the processes as stated above are used for a wide variety of purposes such as a so-called gate array IC.

A process of forming bumps in a conventional method of manufacturing IC devices will now be described with reference to FIGS. 3A to 3E. Firstly, a protective film 12 is formed by CVD including $SiO_2$ or $Si_3N_4$ by exposing the neighborhood of the center of the surface of an electrode pad 13 on a semiconductor substrate 11 with an IC formed thereon. Thereafter, a metal layer 15 including a conductive metal is formed over the entire surface of semiconductor substrate 11, having a thickness of several thousand Å to 1μm (see FIG. 3A). Then, an opening is made only in the region on metal layer 15 where the bumps are to be formed, and a resist 16a is formed by lithography (see FIG. 3B).

Then, a bump 17 is formed within the opening of resist 16a by electroplating (see FIG. 3C), and thereafter, resist 16a is removed (see FIG. 3D). Then, metal layer 15 is etched using bump 17 as a mask (see FIG. 3E).

Though metal layer 15 is formed as a single layer in some cases, normally, it has a multilayer structure employing, as a bottom layer, a material having a strong adhesion with an aluminum pad 13 and, as the top layer, a material having a strong adhesion with bump 17.

Gold, for example, is employed as the material of bump 17. The reason why solder, which has been often used as a material for the bump, is not used is as follows. One method of forming solder bumps is to dip the semiconductor substrate 11 in a solder bath after patterning metal layer 15. The other method is to form a resist mask where an opening is formed only in the region in which the bumps are to be formed, on metal layer 15 formed over the entire surface of semiconductor substrate 11 and to deposit solder within this opening. In the former method in which the semiconductor substrate is dipped in the solder bath, as shown in FIG. 4, the upper portion of a formed solder bump 27 takes a big swollen shape. As for the arrangement of aluminum pad 13, as the integration density of the IC becomes higher, as shown in FIG. 10, the pitch p becomes, for example, 100μm, and the distance g becomes smaller, i.e., about 30μm. In this case, if the upper portion thereof becomes swollen like solder bump 27 in FIG. 4, adjacent solder bumps 27 come in contact with each other. Additionally, it becomes necessary to pattern metal layer 15 before forming the bump, therefore requiring a photolithography process for the resist mask for that reason. According to the latter method, formation is carried out in the same processes as those shown in FIGS. 3A to 3D stated above before the etching process for metal layer 15. However, as solder is inferior with respect to an etching-resistant property, if metal layer 15 is to be etched using solder bump 37 as a mask, solder bump 37 is also etched. Accordingly, the etching process for metal layer 15 required an extremely difficult process in which the outer surface of solder bump 37 was covered with a resist mask, making its practical application impossible.

Accordingly, it was indispensable to apply the method of forming the bumps by electroplating shown in FIGS. 3A to 3E.

According to the above-mentioned conventional method of forming bumps by electroplating, however, in removing, by etching, metal layer 15 outside the region where bump 17 was to be formed, metal layer 15 immediately below bump 17 was also etched by over-etching as indicated by the arrow A in FIG. 3E, so that, in some cases, the adhesion strength of bump 17 was decreased, corrosion of aluminum pad 13 was caused by the etchant, or an etching residue of metal layer 15 was caused in a region other than the region where the bump 17 was to be formed. As a result, a conduction failure and peeling between bump 17 and aluminum pad 13 or an insulation failure of the IC was caused.

SUMMARY OF THE INVENTION

An object of the present invention is to provide a method of manufacturing IC devices in which over-etching and an etching residue of a metal layer can be prevented in a process of manufacturing the IC devices on a semiconductor substrate wherein bumps provided for connection with external terminals are formed on electrode pads to be input terminals of the IC devices with the conductive metal layer interposed therebetween.

In the method of manufacturing the IC devices according to the present invention to achieve the above-mentioned object, an opening is made in the region where a metal layer to be formed later adheres closely to an electrode pad and a first resist having a prescribed thickness is formed on a semiconductor substrate having the electrode pad formed thereon. Thereafter, the metal layer having a prescribed thickness is formed over the semiconductor substrate, and furthermore, an opening is made in a region almost the same as the opening region of the first resist and a second resist having a prescribed thickness is formed over it. Then, a bump is formed within the opening of the second resist, and thereafter, the second resist is removed. Next, the first resist is removed after removing an exposed portion in the metal layer.

According to the above-mentioned method of manufacturing the IC devices, as the first resist is formed before forming the metal layer, the metal layer has a portion joined to the lower sidewalls of the bump at its periphery. As a result, even if overetching is caused to some degree in etching the metal layer, the overetching is prevented from proceeding to the metal layer located at the bottom portion of the bump.

Additionally, even if an etching residue of the metal layer is caused, the etching residue is also removed at the same time that the first resist is removed.

In a preferred embodiment of the present invention, a material is used as the first resist, which is not affected in the process of removing the second resist and in the process of removing the exposed portion of the metal layer. The initial configuration of the first resist is thereby maintained until the metal layer is formed into a desired shape.

Furthermore, in the preferred embodiment of the present invention, as for the metal layer, a first layer superior in adhesion with the electrode pad is formed at first and then a second layer superior in adhesion with the bumps is formed over it. As a result, the metal layer firmly sticks to both of the electrode pad and the bumps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description will now be made of a method of manufacturing IC devices according to one embodiment of the present invention with reference to FIGS. 7A to 7G.

Figure 1A:
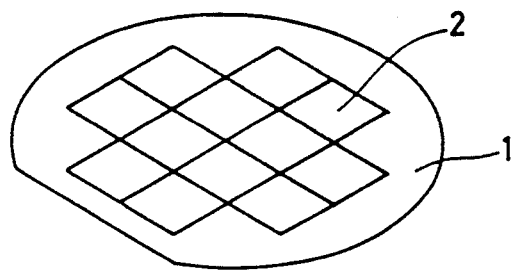
FIGS. 1A, 1B, and 1C are perspective views sequentially showing the outline from the conventional wafer process to the wiring process of IC chips having bumps formed thereon with FIG. 1A showing the state in which the IC chips are formed on the wafer, FIG. 1B showing the state in which the bumps are arranged on each of the IC chips, and FIG. 1C showing a process of bonding each IC chip to inner leads carried by a tape carrier.
Figure 1B:
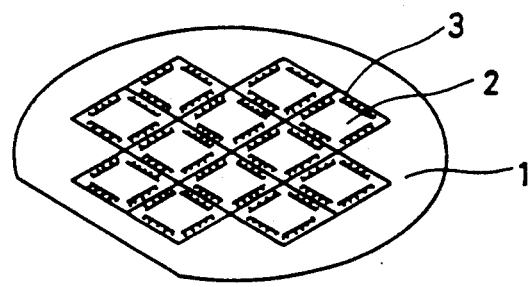
Figure 1C:
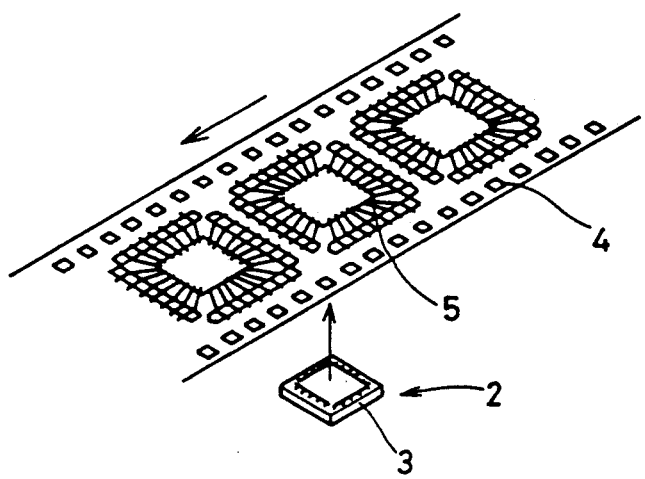
Figure 2A:
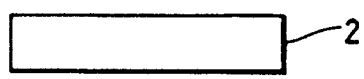
FIGS. 2A, 2B and 2C are diagrams sequentially showing the process of forming one IC chip having bumps.
Figure 2B:
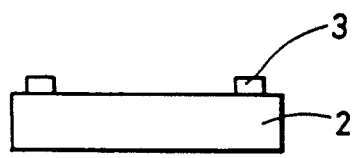
Figure 2C:
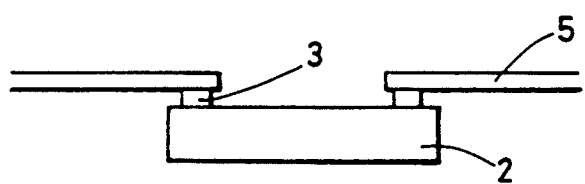
Figure 3A:
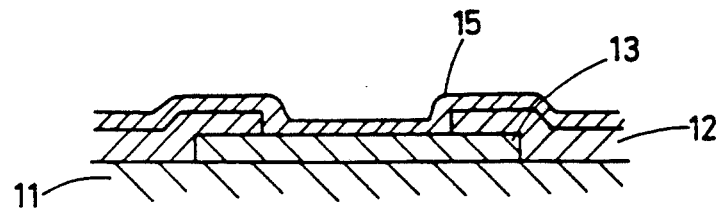
FIGS. 3A, 3B, 3C, 3D and 3E are cross-sectional views sequentially showing the process of forming a bump in the conventional method of manufacturing an IC device.
Figure 3B:
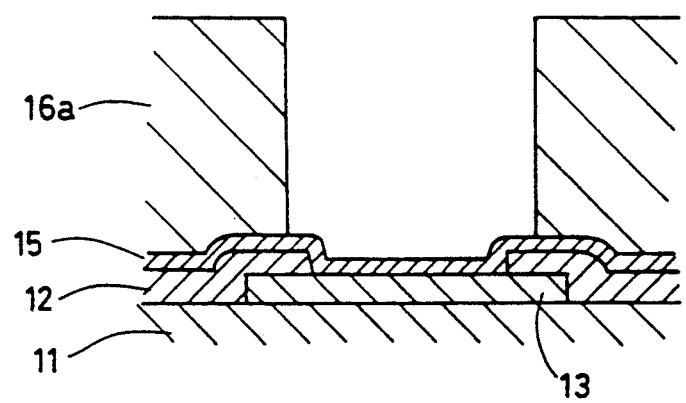
Figure 3C:
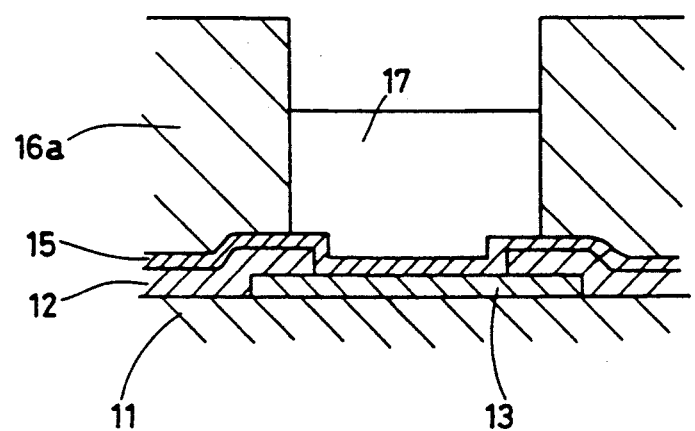
Figure 3D:
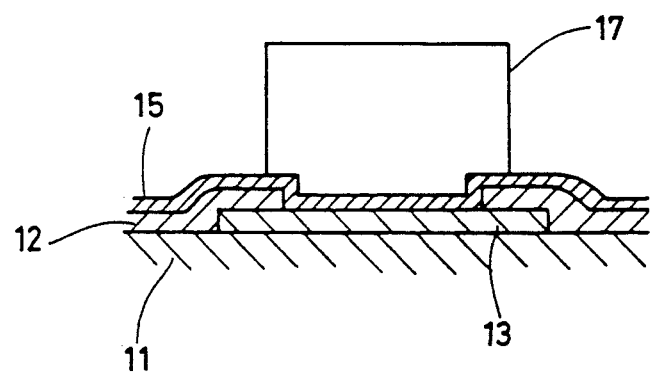
Figure 3E:
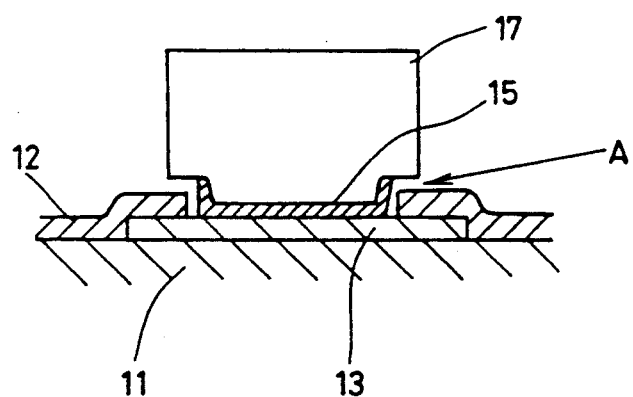
Figure 4:
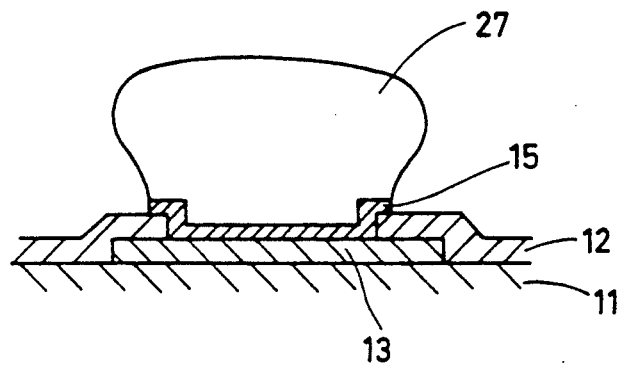
FIG. 4 is a cross-sectional view for describing a problem when a solder bump is formed by packing the substrate in a solder bath.
Figure 5:
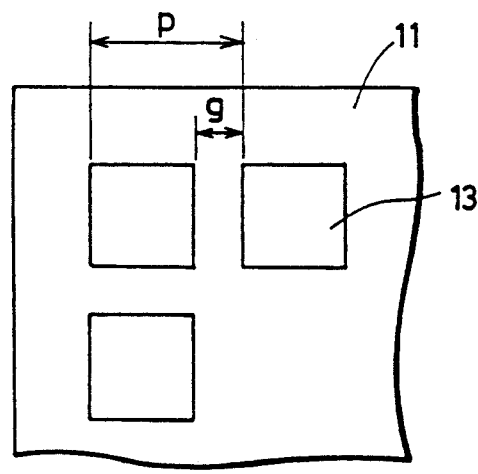
FIG. 5 is a diagram for describing the dimension in the arrangement of aluminum pads on the IC chip.
Figure 6:
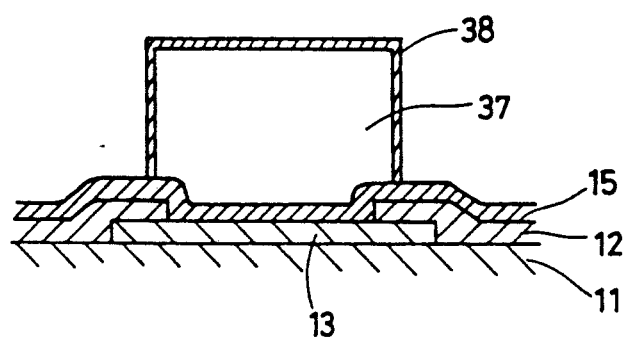
FIG. 6 is a cross-sectional view for describing a problem when bumps are formed by depositing solder.
Figure 7A:
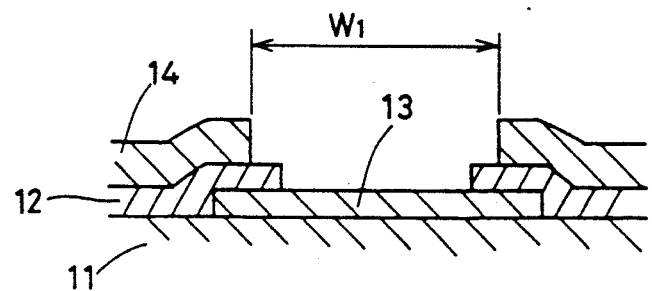
FIGS. 7A, 7B, 7C, 7D, 7E, 7F and 7G are cross-sectional views sequentially showing a process of forming a bump in a method of manufacturing IC devices according to one embodiment of the present invention.

In this embodiment, firstly, a first resist 14 is formed, having a pattern obtained by making an opening in the region where an aluminum pad 13 is formed with a protective film 12 interposed therebetween, covering and protecting the periphery of aluminum pad 13 as an electrode pad on a semiconductor substrate 11 having an IC formed thereon (see FIG. 7A). The first resist 14 needs to have such a chemical-resistant property that it is not etched in etching a metal layer 15 in a later process. It is also necessary to use a material which is not affected in a lithography process of a second resist 16 as described later. A gum type negative resist, for example, is used for the material of the first resist 14. The gum type negative resist is obtained by adding a bisazide type compound as a photosensitive cross linking agent to a cyclocantchonc type resin.

Figure 7B:
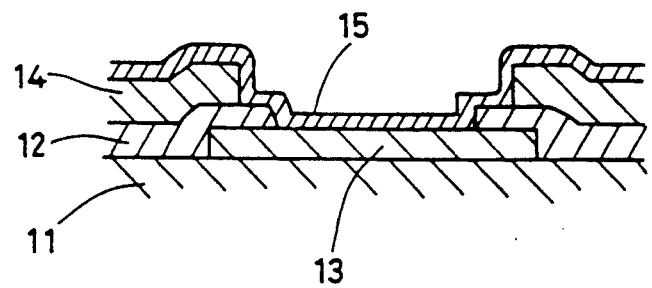
Figure 8:
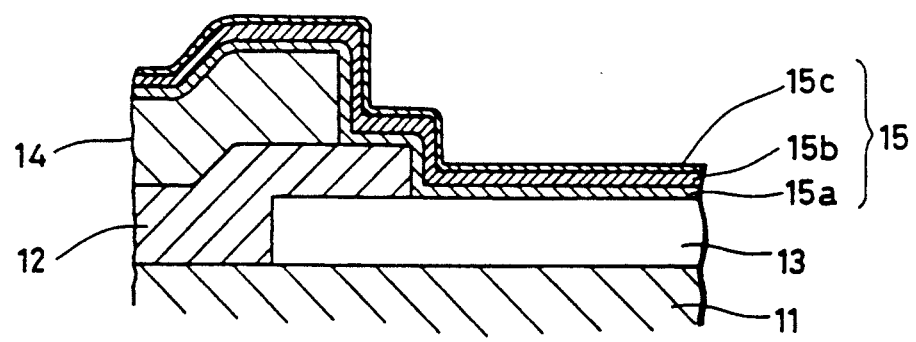
FIG. 8 is an expanded fragmentary view in section expanding and showing a cross-sectional structure when the metal layer 15 has a triple layered structure.

Then, a metal layer 15 is formed, on which surface a bump 17 is to be formed at a prescribed position (see FIG. 7B). The metal layer 15 may be a single layer including one kind of material or may have a multi-layered structure including a plurality of different layered materials as far as the material has a strong conductivity and adhesion with bump 17 and an aluminum pad 13. In this embodiment, as shown in FIG. 8, metal layer 15 is formed having a triple layered structure as one example of a multi-layered structure. Chromium or titanium having a strong adhesion with aluminum pad 13 is employed as the material of a first layer 15a of metal layer 15 in this embodiment the thickness thereof is on the order of 1000Å–5000Å. A material having a strong adhesion with bump 17 is employed for a second layer 15b, for example, copper or palladium is used when bump 17 is a gold bump. The thickness thereof is also on the order of 1000Å–5000Å. A third layer 15c includes a gold film instantaneously formed by flash plating, flash deposition or the like, having a thickness of about 500Å. This gold film is formed in order to prevent oxidation of the second layer 15b and to further enhance the adhesion with the bump 17. The first layer 15a and the second layer 15b are formed by sputtering, because sputtering is superior to other methods with respect to the adhesion strength, contact resistance and so on.

Figure 7C:
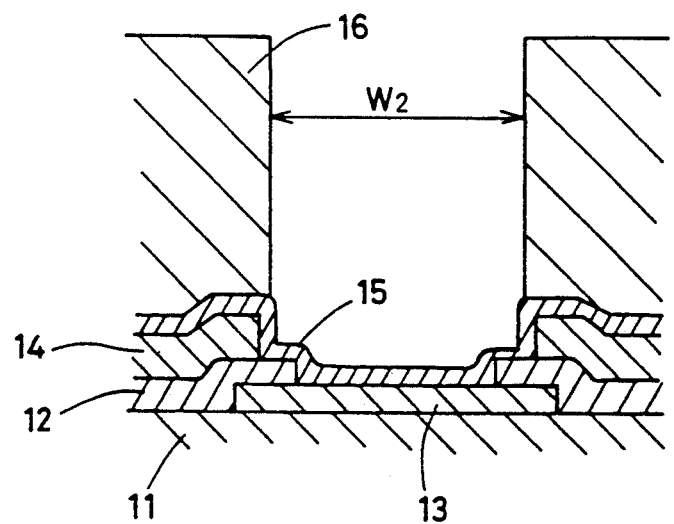

Then, the pattern of the second resist 16 for forming bump 17 is formed by a photolithography process (see FIG. 7C). At this time, the opening size ($W_2$ shown in the figure) of the second resist 16 is slightly smaller than the size $W_1$ (see FIG. 7A) of the opening portion of the first resist 14. That is, $W_2$ is smaller than $W_1$ by twice the thickness of metal layer 15.

Figure 7D:
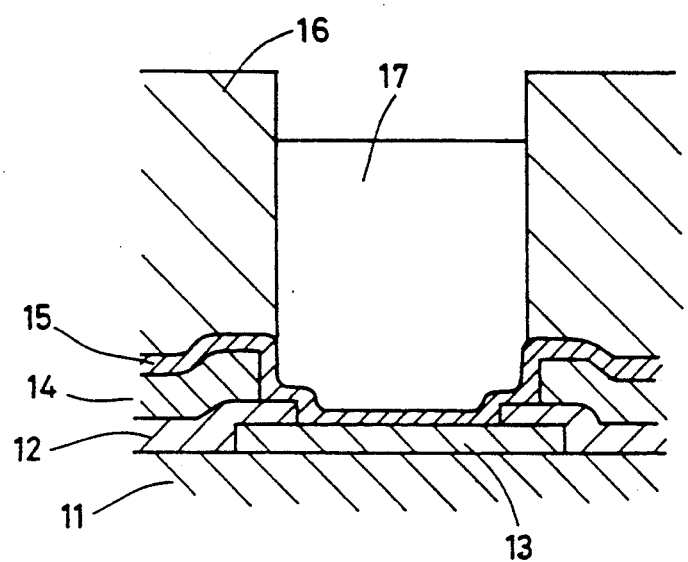

Thereafter, bump 17 is formed within the opening of the second resist 16 by electroplating (see FIG. 7D). In the case of this embodiment, a gold bump is formed as bump 17. Electroplating of bump 17 is carried out by electrolytic gold plating using a well known plating bath apparatus. The regions where bumps 17 are to be formed, that is, the regions where the aluminum pads 13 are disposed are arranged with almost the same distances therebetween in the periphery of the IC chips, with the pitch being 100μm and the size of the individual aluminum pad 13 is on the order of □70μm.

Figure 7E:
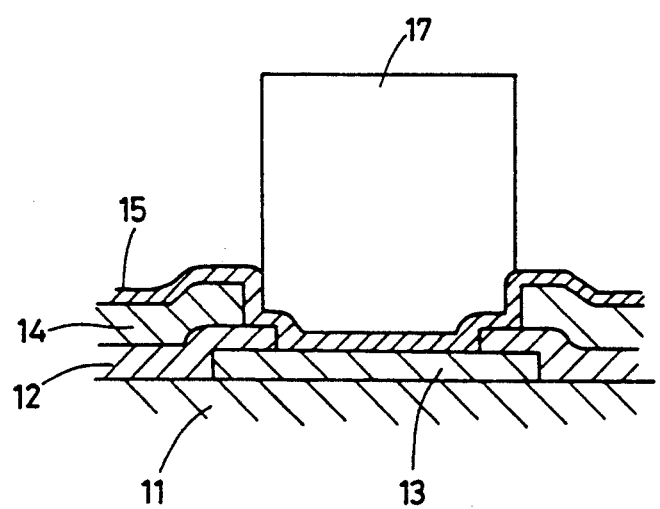
Figure 7F:
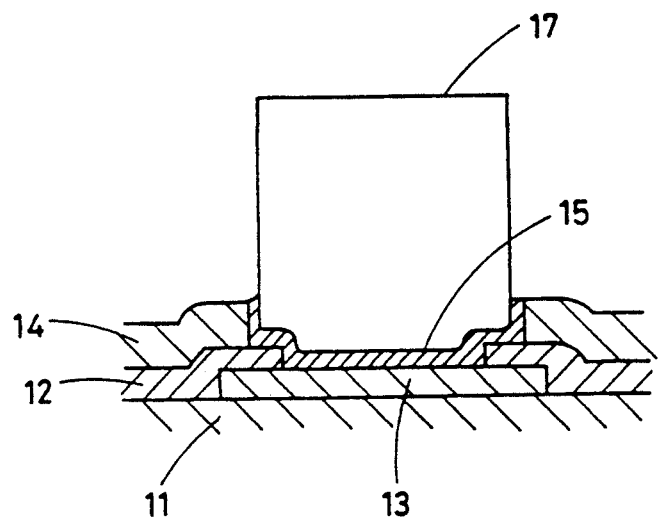

The second resist 16 is peeled and removed after electroplating of bump 17 is completed (see FIG. 7E). Then, metal layer 15 is etched using bump 17 as a mask (see FIG. 7F). At this time, overetching is not caused to metal layer 15 immediately below bump 17 until metal layer 15 located between the opening portion sidewalls of the first resist 14 and the sidewalls of bump 17 is etched.

Figure 7G:
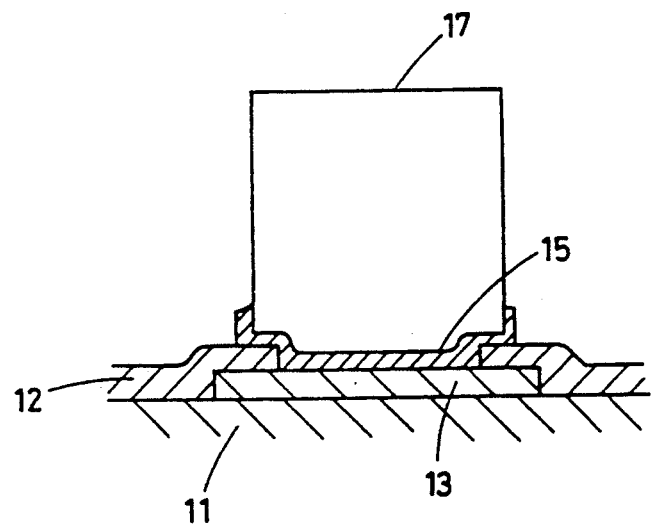

The first resist 14 is peeled and removed after etching of metal layer 15 is completed (see FIG. 7G). As metal layer 15 includes a material which is relatively hard to be corroded, an etching residue is easily generated. However, the generated etching residue can be also easily removed at the same time that the first resist 14 is removed. In this embodiment, an enchant according to the material of each layer is employed for etching of metal layer 15 having the triple-layered structure. That is, potassium cyanide solution or an aqua regia type (a mixed acid of nitric acid and hydrochloric acid) enchant is employed for etching the gold film of the third layer 15c at first. Phosphoric acid or nitric acid is used for etching the copper film of the second layer 15b. The first layer 15a is etched using potassium ferrocyanide solution when it is a chrome film or using hydrochloric acid or sulfuric acid is used when it is a titanium film.

The second resist 16 needs to include a material which is not corroded by the plating solution since the electroplating is carried out within the opening thereof. There are several kinds of plating solutions having different chemical properties such as cyanogen type or non-cyanogen type when bump 17 is formed by gold plating. A gum type negative resist is a material which is relatively resistant to any plating solution. This material, however, is used as the first resist 14, it is not suited for this purpose. That is, since the first resist 14 needs to remain without being peeled in removing the second resist 16 by peeling, it is inappropriate that the gum type negative resist, which is used as the first resist 14, is used here as the material of the second resist 16. An acrylate resin type negative resist or a novolak resin type positive resist may be used as the material of the second resist 16. The novolak resin type positive resist is obtained by adding a naphthoquinone diazide type compound as a photolysis agent to phenol novolak resin.

Figure 9:
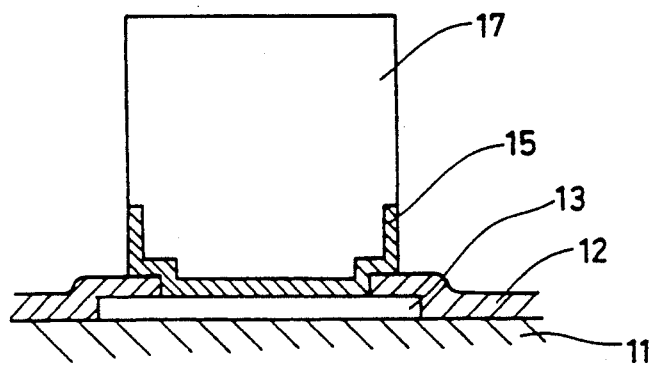
FIG. 9 is a cross-sectional view showing the structure in the vicinity of a bump formed according to another embodiment of the present invention.
Figure 10:
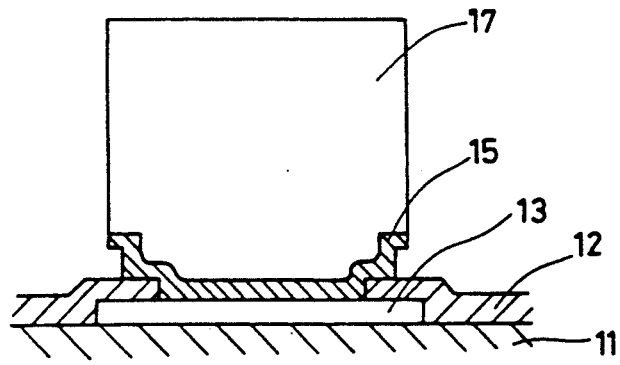
FIG. 10 is a cross-sectional view showing the structure in the vicinity of a bump formed according to still another embodiment of the present invention.

Though the opening size $W_2$ of the second resist 16 is set to be slightly smaller than the opening size $W_1$ of the first resist 14 in the embodiment above, $W_1$ and $W_2$ may be almost the same, or $W_2$ may be set to be slightly larger than $W_1$. If $W_1$ and $W_2$ are almost the same, the configuration of the cross section after etching metal layer 15 is the one as shown in FIG. 9. That is, the outer side surface of metal layer 15 and the side surface of bump 17 are on the same plane. If $W_z$ is larger than $W_1$, the peripheral portion of metal layer 15 extends horizontally in the periphery of the bottom portion of bump 17 as shown in FIG. 10. In the cross-sectional structures shown in FIGS. 9 and 10, similarly in the embodiment stated above, overetching of metal layer 15 located at the bottom portion of bump 17 is prevented.

Figure 11A:
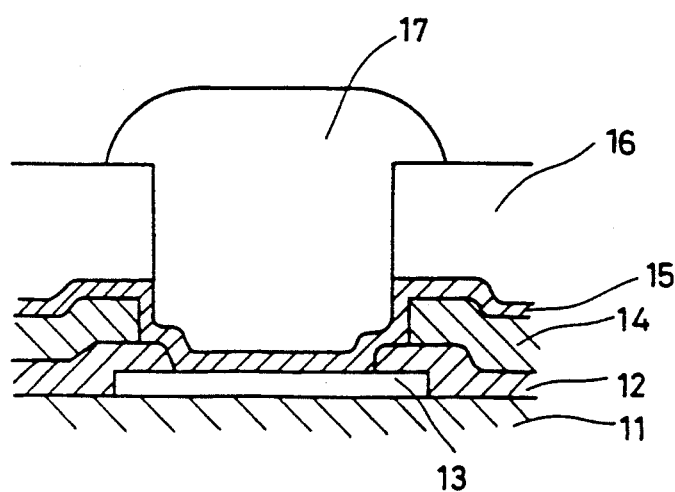
FIG. 11A is a cross-sectional view showing the structure immediately after a bump is formed when the present invention is applied to a process of forming a so-called mushroom shaped bump.
Figure 11B:
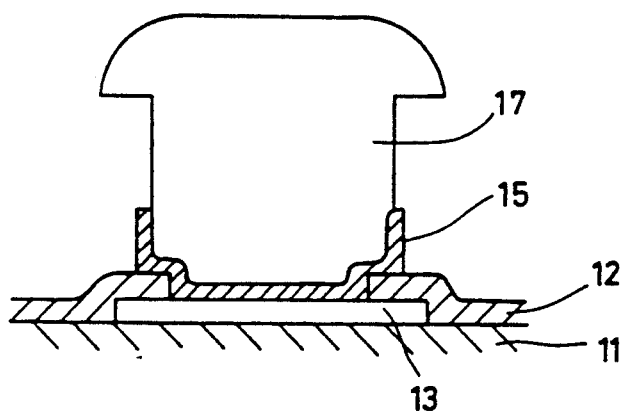
FIG. 11B is a cross-sectional view showing the structure after removing an unnecessary resist and metal layer in the same case as in FIG. 11A.

While the case has been described where the height of bump 17 is lower than that of the opening portion of the second resist 16 in the above-mentioned embodiment, the present invention can be similarly applied to a case where bump 17 is formed higher than the second resist 16 in the same way. In this case, as shown in FIG. 11A, the electroplating proceeds, expanding outwardly from the opening portion above the upper end surface of the second resist 16 and a so-called mushroom-shaped bump 17 is formed. A cross-sectional structure as shown in FIG. 11B is obtained by removing the second resist 16, etching metal layer 15, and then removing the first resist 14.

As stated above, in accordance with each of the embodiments described above, a structure can be realized where metal layer 15 located at the bottom portion of bump 17 is hard to be overetched, and degradation of the adhesion between bump 17 and aluminum pad 13 can be prevented by forming the first resist 14 having an opening size almost the same as or slightly smaller than the opening size of the second resist 16 for forming bump 17 before forming metal layer 15.

Additionally, even if an etching residue is caused in etching metal layer 15, the etching residue is also removed at the same time that the second resist 16 is removed, so that degradation of the insulation property of the circuit can be prevented and a process of manufacturing IC devices can be realized with an extremely limited possibility of defects being caused.

Although the present invention has been described an illustrated in detail, it is clearly understood that the same is by way of illustration and example only and is not to be taken by way of limitation, the spirit and scope of the present invention being limited only by the terms of the appended claims.

What is claimed is:

1. A method of manufacturing integrated circuit devices or forming bumps provided for use in connection with external terminals on an electrode pad to be an input/output terminal of an integrated circuit over a semiconductor substrate having the integrated circuit formed thereon, with a conductive metal layer interposed therebetween, comprising the steps of:

making an opening int he region where said metal layer is closely in contact with said electrode pad over said semiconductor substrate having said electrode pad formed thereon and forming a first resist having a prescribed thickness;

forming said metal layer having a prescribed thickness over the semiconductor substrate after the formation of this first resist;

making an opening int he region smaller than the opening region of said first resist nd forming a second resist having a prescribed thickness over said metal layer;

forming the bumps within the opening of the second resist by electroplating;

removing said second resist after the formation of the bumps;

removing an exposed portion in said metal layer after the removal of the second resist; and removing said first resist.

2. The method of manufacturing integrated circuit devices according to claim 1, wherein a material which is not affected in said process of removing the second resist and said process of removing the exposed portion of the metal layer is employed as said first resist.

3. The method of manufacturing integrated circuit devices according to claim 1, wherein a gum type negative resist is used as the material of said first resist.

4. The method of manufacturing integrated circuit devices according to claim 1, wherein said step of forming the metal layer includes a step of forming a single layer of a single material superior in adhesion with both of said electrode pad and said bumps over the semiconductor substrate after the formation of said first resist.

5. The method of manufacturing integrated circuit devices according to claim 1, wherein said step of forming the metal layer includes the steps of firstly forming a first layer including a material superior in adhesion with said electrode pad over the semiconductor substrate after the formation of said first resist and forming a second layer including a material superior in adhesion with said bumps over the first layer.

6. The method of manufacturing integrated circuit devices according to claim 5, wherein said step of forming the metal layer further includes a step of forming a third layer for enhancing the adhesion between said second layer and said bumps over said second layer.

7. The method of manufacturing integrated circuit devices according to claim 5, wherein said electrode pad includes aluminum and said step of forming said first layer of the metal layer is carried out by sputtering chromium or titanium.

8. The method of manufacturing integrated circuit devices according to claim 5, wherein said second layer of said metal layer is formed by sputtering copper or palladium on said first layer and said bumps are formed by electrolytic gold plating.

9. The method of manufacturing integrated circuit devices according to claim 6, wherein said third layer of said metal layer is formed by forming a gold film on said second layer and said bumps are formed by electrolytic gold plating.

10. The method of manufacturing integrated circuit devices according to claim 9, wherein said gold film is instantaneously formed on said second layer by flash plating or flash deposition.

11. The method of manufacturing integrated circuit devices according to claim 6, wherein said step of forming the metal layer includes the steps of forming said first layer having a thickness of 1000Å–5000Å by depositing chromium or titanium by sputtering over the semiconductor substrate including the surface of electrode pad including aluminum, after the formation of the first resist, forming said second layer having a thickness of 1000Å–5000Å by depositing copper or palladium on said first layer by sputtering, and forming the third layer having a thickness of about 500 Å by instantaneously forming a gold film on said second layer by flash plating or flash deposition.

12. The method of manufacturing integrated circuit devices according to claim 1, wherein said second resist is formed so that the opening width size of said second resist is smaller than the opening width size of said first resist by about twice the thickness of said metal layer.

13. The method of manufacturing integrated circuit devices according to claim 9, wherein said step of removing the gold film of the third layer in the step of removing the exposed portion of said metal layer includes an etching step using a potassium cyanide solution or an aqua regia type etchant.

14. The method of manufacturing integrated circuit devices according to claim 8, wherein said step of removing the second layer in the step of removing the exposed portion of said metal layer includes an etching step using phosphoric acid or nitric acid.

15. The method of manufacturing integrated circuit devices according to claim 7, wherein said first layer of said metal layer is a chromium film, and said step of removing the first layer in the step of removing the exposed portion of said metal layer includes an etching step using a potassium ferrocyanide solution.

16. The method of manufacturing integrated circuit devices according to claim 7, wherein said first layer of said metal layer is a titanium film, and said step of removing the first layer in the step of removing the exposed portion of said metal layer includes an etching step using hydrochloric acid or sulfuric acid.

17. The method of manufacturing integrated circuit devices according to claim 1, wherein a material which is not corroded by a plating solution used for electroplating of said bumps is employed as said second resist.

18. The method of manufacturing integrated circuit devices according to claim 17, wherein an acrylate resin type negative resist or a novolak resin type positive resist is employed as the material of said second resist.

19. The method of manufacturing integrated circuit devices according to claim 1, including etching said metal layer using the bump as a mask.

20. The method of manufacturing integrated circuit devices according to claim 19, wherein said step of etching includes using said first resist to protect said metal layer below the bump from overetching.

* * * * *